(12) United States Patent
Wang et al.

(10) Patent No.: US 9,563,095 B2
(45) Date of Patent: *Feb. 7, 2017

(54) PIXEL STRUCTURE AND MANUFACTURING METHOD THEREFOR, ARRAY STRUCTURE, DISPLAY PANEL AND DISPLAY DEVICE

(71) Applicants: Shanghai AVIC OPTO Electronics Co., Ltd., Shanghai (CN); Tianma Micro-Electronics Co., Ltd., Shenzhen (CN)

(72) Inventors: Tinghai Wang, Shanghai (CN); Zhaokeng Cao, Shanghai (CN); Yao Lin, Shanghai (CN); Dandan Qin, Shanghai (CN)

(73) Assignees: SHANGHAI AVIC OPTO ELECTRONICS CO., LTD., Shanghai (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/742,599

(22) Filed: Jun. 17, 2015

(65) Prior Publication Data

US 2016/0103350 A1    Apr. 14, 2016

(30) Foreign Application Priority Data

Oct. 10, 2014    (CN) .......................... 2014 1 0531284

(51) Int. Cl.
  *H01L 27/12*       (2006.01)
  *G02F 1/1368*      (2006.01)
  *G02F 1/1343*      (2006.01)
  *G02F 1/1362*      (2006.01)
  *G02F 1/1337*      (2006.01)

(52) U.S. Cl.
  CPC ....... *G02F 1/1368* (2013.01); *G02F 1/134363* (2013.01); *H01L 27/124* (2013.01); *H01L 27/1259* (2013.01); *G02F 1/133707* (2013.01); *G02F 1/136286* (2013.01)

(58) Field of Classification Search
  CPC .......................... H01L 27/124; H01L 27/1259
  See application file for complete search history.

(56) References Cited

U.S. PATENT DOCUMENTS

| | | | |
|---|---|---|---|
| 2009/0225267 A1* | 9/2009 | Atarashiya | ........ G02F 1/134363 349/139 |
| 2015/0116644 A1* | 4/2015 | Morishita | ......... G02F 1/133345 349/138 |

FOREIGN PATENT DOCUMENTS

| | | |
|---|---|---|
| JP | 2014041366 A | 3/2014 |
| WO | 2013168566 A1 | 11/2013 |

* cited by examiner

*Primary Examiner* — Whitney T Moore
(74) *Attorney, Agent, or Firm* — Faegre Baker Daniels LLP (57) ABSTRACT

A pixel structure and manufacturing method therefor, an array structure, a display panel and a display device. And the pixel structure includes data lines; scan lines; pixel units formed by intersecting the data lines with the scan lines, where each pixel unit corresponds to one data line and one scan line; a TFT and a pixel electrode disposed in each of pixel units, where the pixel electrode includes slits, at least one of which includes at least one corner area at an end thereof; where the pixel electrode in a row is electrically connected to a TFT in a pixel unit, the pixel unit is disposed in the same row as and adjacently at one side of the pixel electrode, and at least one corner area of the pixel electrode extends toward the TFT electrically connected to the pixel electrode.

14 Claims, 8 Drawing Sheets

PIXEL STRUCTURE AND MANUFACTURING METHOD THEREFOR, ARRAY STRUCTURE, DISPLAY PANEL AND DISPLAY DEVICE

CROSS-REFERENCE TO RELATED APPLICATION

This application claims priority to Chinese Application No. 201410531284.7, filed Oct. 10, 2014, which is herein incorporated by reference in its entirety.

TECHNICAL FIELD

The present disclosure relates to a field of display technologies, in particular to a pixel structure and a manufacturing method therefor, an array structure, a display panel and a display device.

BACKGROUND

With the development of display technologies, Liquid Crystal Display (LCD) devices have been increasingly, widely used, and the display effect thereof is constantly improved.

Figure 1:
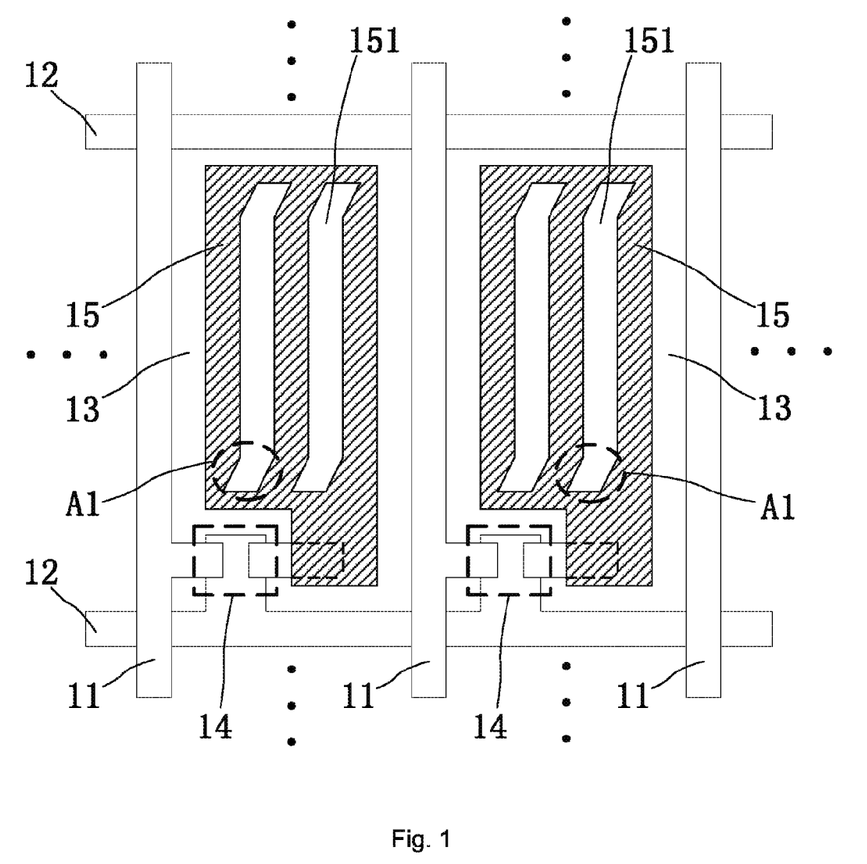
FIG. 1 is a schematic diagram showing a pixel structure in the related art.

A pixel structure disposed on a Thin Film Transistor (TFT) array substrate is an important part of a Liquid Crystal Display device, and different display effects of the Liquid Crystal Display device may result from different pixel structures. FIG. 1 is a schematic diagram showing a pixel structure in the related art. As shown in FIG. 1, a pixel structure of a Liquid Crystal Display device in the related art includes a plurality of data lines 11, a plurality of scan lines 12, a plurality of pixel units 13 formed by intersecting the data lines 11 with the scan lines 12, TFTs 14 and pixel electrodes 15 disposed in pixel units 13, where each of the pixel electrodes 15 includes a plurality of slits 151, and each slit 151 has two corner areas A1 at both ends thereof (e.g. an upper end and a lower end of the slit as shown in FIG. 1).

As seen from FIG. 1, a length of the corner area A1 is limited by the size of the pixel unit 13, and excessive length of the corner area A1 will likely cause the break of the pixel electrode 15. Due to the limited length of the corner area A1, an end of the corner area A1 cannot be covered by a black matrix in a color filter substrate after the color filter substrate is attached to the array substrate, in this case, an electric field formed at the end of the corner area A1 controls liquid crystal molecules differently from an electric field formed at the rest part of the slit 151, thus reduction in light transmittance is caused by the electric field formed at the end of the corner area A1, comparing with the electric field formed at the rest part of the slit, in displaying by the Liquid Crystal Display device.

SUMMARY

In view of this, embodiments of the disclosure provide a pixel structure and a manufacturing method therefor, an array structure, a display panel and a display device, thereby solving the technical problem of the reduction in light transmittance caused by the limited length of a corner area of the slit in the pixel electrode in the related art.

In a first example, embodiments of the disclosure provide a pixel structure including:
 a plurality of data lines;
 a plurality of scan lines;
 a plurality of pixel units formed by intersecting the plurality of data lines with the plurality of scan lines, where a pixel unit corresponds to one of the data lines and one of the scan lines;
 a TFT and a pixel electrode disposed in each of the pixel units, where the pixel electrode includes a plurality of slits, at least one of which includes at least one corner area at an end thereof;
 where the pixel electrode is electrically connected to a TFT in a pixel unit which is disposed in the same row as and adjacently at one side of a pixel electrode including the pixel electrode, and at least one corner area of the pixel electrode extends toward the TFT electrically connected to the pixel electrode.

In a second example, embodiments of the disclosure provide a manufacturing method for a pixel structure, which includes the following steps:
 forming a plurality of TFTs;
 forming a plurality of data lines and a plurality of scan lines, where a plurality of pixel units are formed by intersecting the plurality of data lines with the plurality of scan lines, and a pixel unit corresponds to one of the data lines and one of the scan lines and includes one of the TFTs; and
 forming a plurality of pixel electrodes, where a pixel electrode is disposed in one pixel unit and includes a plurality of slits, at least one of which includes at least one corner area at an end thereof, and the pixel electrode is electrically connected to a TFT in a pixel unit which is disposed in the same row as and adjacently at one side of a pixel unit comprising the pixel electrode, and at least one corner area of the pixel electrode extends toward the TFT electrically connected to the pixel electrode.

In a third example, embodiments of the disclosure provide an array substrate including the pixel structure described above.

In a fourth example, embodiments of the disclosure provide the array substrate described in the third example.

In a fifth example, embodiments of the disclosure provide a display device including the display device described in the fourth example.

With the pixel structure and the manufacturing method therefor, the array structure, the display panel and the display device according to embodiments of the disclosure, a pixel electrode is electrically connected to a TFT in a pixel unit which is in the same row as and adjacently at one side of the pixel electrode, and at least one corner area of the pixel electrode extends toward the TFT electrically connected to the pixel electrode, so that a length of the extended corner area, is increased, and accordingly an end of the corner area is disposed close to the TFT electrically connected to the pixel electrode including the corner area, therefore the end of the corner area can be well covered by a black matrix of a color filter substrate after the color filter substrate is attached to the array substrate, thereby improving the light transmittance.

While multiple embodiments are disclosed, still other embodiments of the disclosure will become apparent to those skilled in the art from the following detailed description, which shows and describes illustrative embodiments of the disclosure. Accordingly, the drawings and detailed description are to be regarded as illustrative in nature and not restrictive.

BRIEF DESCRIPTION OF THE DRAWINGS

With the detailed non-limiting embodiments described with reference to accompanying drawings, other features, purposes and advantages of the present disclosure will become more apparent.

While the disclosure is amenable to various modifications and alternative forms, embodiments have been shown by way of example in the drawings and are described in detail below. The intention, however, is not to limit the disclosure to the particular embodiments described. On the contrary, the disclosure is intended to cover all modifications, equivalents, and alternatives falling within the scope of the disclosure as defined by the appended claims.

DETAILED DESCRIPTION

The disclosure will be described below further in detail with reference to the accompanying drawings and the embodiments. It is appreciated that the embodiments described herein are used to explain the disclosure, rather than limiting the disclosure. It is further noted that, to facilitate the description, a part not the whole of content is shown in the accompanying drawings, the part is related to the disclosure.

Figure 2A:
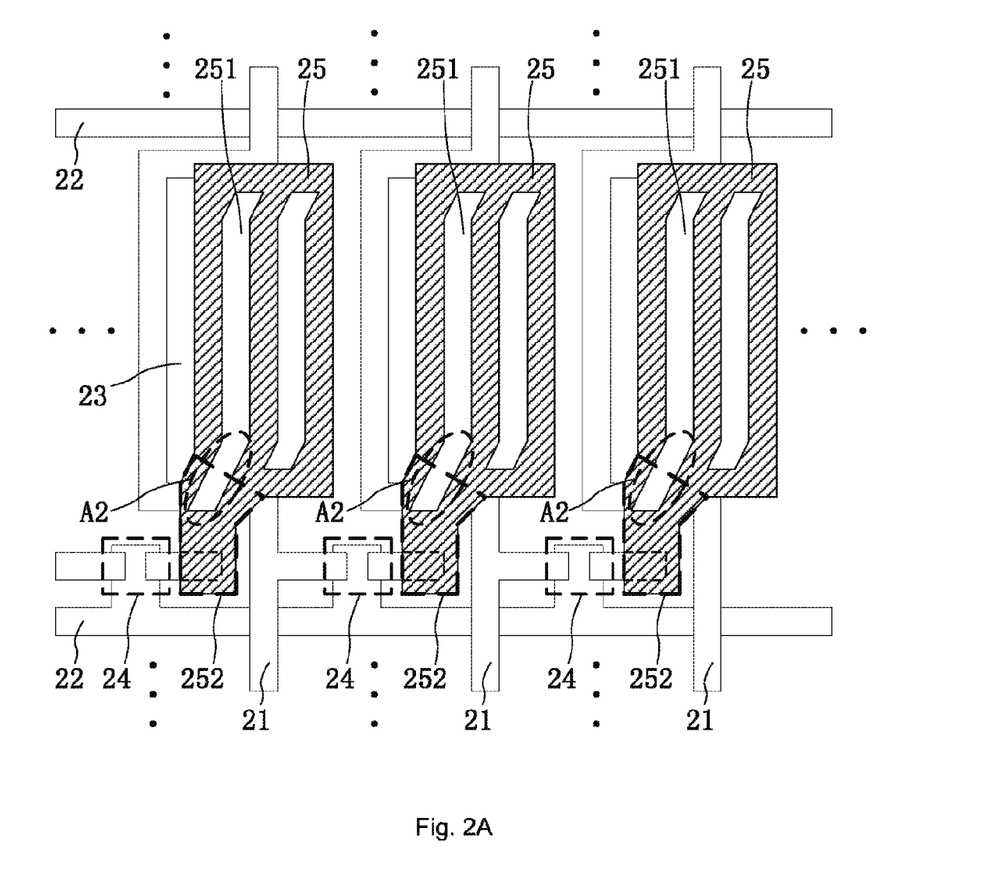
FIG. 2A is a schematic diagram showing a pixel structure according to embodiments of the disclosure.

A pixel structure is provided by embodiments of the disclosure. FIG. 2A is a schematic diagram showing a pixel structure according to embodiments of the disclosure. As shown in FIG. 2A, the pixel structure includes: a plurality of data lines 21; a plurality of scan lines 22; a plurality of pixel units 23 formed by intersecting the data lines 21 with the scan lines 22, where a pixel unit 23 corresponds to one data line 21 and one scan line 22; a TFT 24 and a pixel electrode 25 disposed in each of the plurality of pixel units 23, where the pixel electrode 25 includes a plurality of slits 251, at least one of which has at least one corner area A2 at an end thereof, and the pixel electrode 25 in a row is electrically connected to a TFT 24 of a pixel unit 23, the pixel unit 23 is disposed in the same row as and adjacent to the pixel unit 23 containing the pixel electrode 25 (e.g. at the left side thereof as shown in FIG. 2A), and the at least one corner area A2 of the pixel electrode 25 extends toward the TFT 24 electrically connected to the pixel electrode 25.

It is noted that the display of the pixel unit is realized through the pixel electrode in the pixel unit and the TFT which is electrically connected to the pixel electrode for controlling the pixel electrode. By controlling the pixel electrode, the TFT controls the pixel unit in which the pixel electrode is disposed. The TFT can be controlled to turn on or off by a scan line which is electrically connected to a gate electrode of the TFT, and a data line which is electrically connected to a source electrode of the TFT may provide the pixel electrode electrically connected to the TFT with a data signal when the TFT is turned on. In view of this, the above case where a pixel unit 23 corresponding to one data line 21 and one scan line 22 refers to that the data line 21 corresponding to the pixel unit 23 is the data line 21 electrically connected to the TFT 24 for controlling the pixel unit 23, and the scan line 22 corresponding to the pixel unit 23 is the scan line 22 electrically connected to the TFT 24 for controlling the pixel unit 23.

As shown in FIG. 2A, the pixel electrode 25 in a row is electrically connected to a TFT 24 of a pixel unit 23, the pixel unit 23 is disposed in the same row as and adjacent to the pixel unit 23 containing the pixel electrode 25 (e.g. at the left side thereof as shown in FIG. 2A), through a bridging conductive line 252, which may be made of the same transparent conductive material such as indium tin oxide (ITO) or indium zinc oxide (IZO) as the pixel electrode 25. Due to the presence of the bridging conductive line 252, at least one corner area A1 of the pixel electrode 25 may extend along the bridging conductive line 252 toward the TFT 24 which is electrically connected to the pixel electrode 25. Compared with the pixel structure in the related art, a length of the extended corner area A2 is increased, and an end of the extended corner area A2 is disposed close to the TFT which is electrically connected to the pixel electrode 25 including the extended corner area A2, therefore the end of the corner area A2 can be well covered by a black matrix in a color filter substrate after the color filter substrate is attached to the array substrate, thereby improving the light transmittance.

In some embodiments, in order to electrically connect the pixel electrode 25 in a row to the TFT 24 in a pixel unit 23, the pixel unit is disposed in the same row as and adjacently at the left side of the pixel unit 23 containing the pixel electrode 25, the TFT 24 is preferably disposed close to the pixel electrode 25 electrically connected to the TFT 24, thereby conveniently realizing an electrical connection between the TFT 24 and the pixel electrode 25 electrically connected to the TFT 24 and avoiding any interference between the pixel electrode 25 electrically connected to the TFT 24 and a pixel electrode 25 in a pixel unit 23 including the TFT 24.

In some embodiments, a portion of the data line 21, which is within the pixel unit 23 containing the TFT 24, is bent so as to match a position of the TFT 24, and the portion disposes. Since the TFT 24 is disposed close to the pixel electrode 25 electrically connected to the TFT 24, it is necessary to bend the portion of the corresponding data line 21 within the pixel unit 23 containing the TFT 24 in order to electrically connect the data line 21 with the TFT 24 without shielding the pixel electrode 25, as shown in FIG. 2A. The bent data line 21 in FIG. 2A is an example, and the data line 21 can be otherwise arranged as actually desired as long as the data line 21 is electrically connected to the corresponding TFT 24 without shielding the pixel electrode 25, which is not limited herein.

Figure 2B:
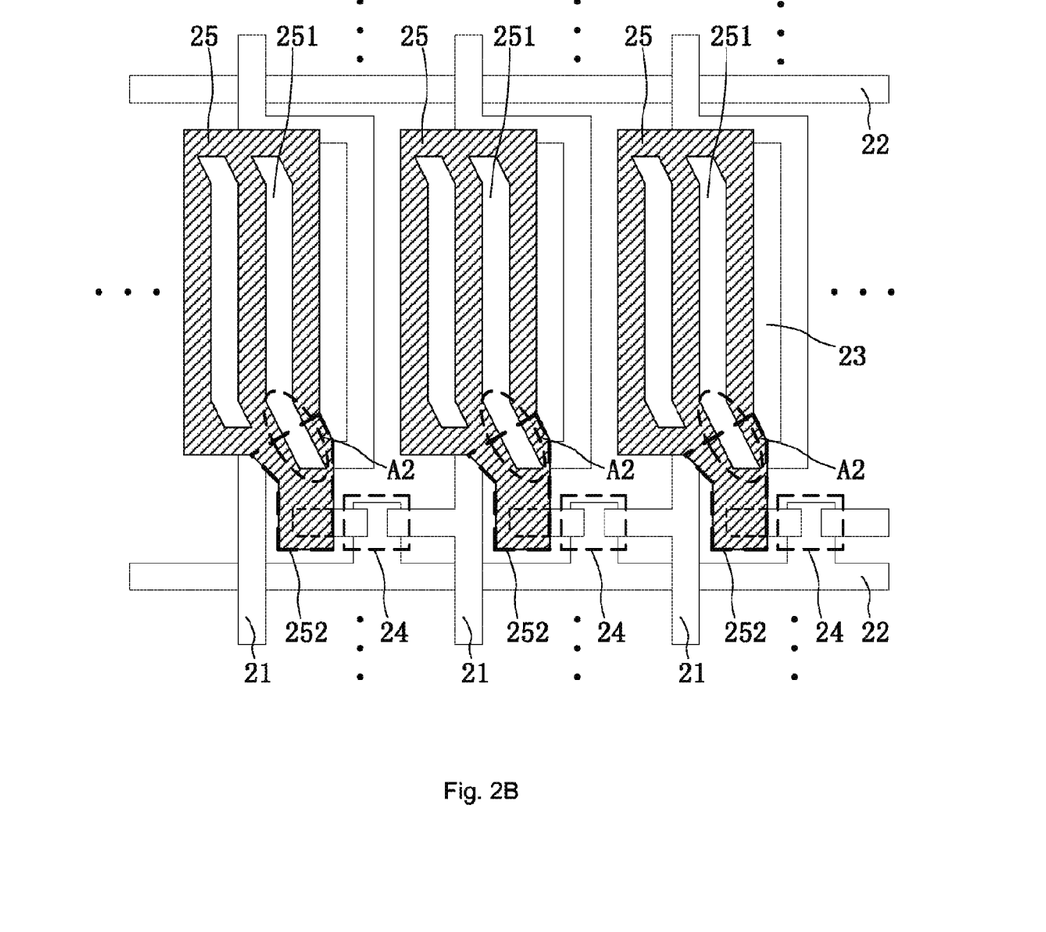
FIG. 2B is a schematic diagram showing a pixel structure according to embodiments of the disclosure.

In addition to the above case where the pixel electrode 25 in a row is electrically connected to a TFT 24 in a pixel unit 23, the pixel unit 23 is disposed in the same row as and adjacently at the left side of the pixel unit 23 containing the pixel electrode 25 as shown in FIG. 2A, the pixel electrode 25 may be alternatively electrically connected to a TFT 24 in a pixel unit 23 which is disposed in the same row as and adjacently at the right side of the pixel unit 23 containing the pixel electrode 25, as shown in FIG. 2B. For the position of the TFT 24 and the arrangement of a data line in the pixel unit 23 containing the TFT 24 in FIG. 2B, reference may be made to the description of FIG. 2A, which will not be repeated herein.

In some embodiments, a source electrode of the TFT 24 is electrically connected to the data line 21 corresponding to a pixel unit 23, the pixel unit 23 contains a pixel electrode 25 electrically connected to the TFT 24; and the gate electrode of the TFT 24 is electrically connected to the scan line 22 corresponding to the pixel unit 23, the pixel unit 23 contains the pixel electrode 25 electrically connected to the TFT 24. As shown in FIG. 2A, the source electrode of the TFT 24 is electrically connected to the data line 21 which is at the left side of a pixel unit 23 including the TFT 24, and configured for providing a data signal to the pixel electrode 25 which is electrically connected to the TFT 24; and the gate electrode of the TFT 24 is electrically connected to the scan line 22 below the pixel unit 23 including the TFT 24, and configured for controlling the turn-on or turn-off of the pixel unit 23 in which the pixel electrode 25 electrically connected to the TFT 24 is disposed. As shown in FIG. 2B, the source electrode of the TFT 24 is electrically connected to the data line 21 which is at the right side of the pixel unit 23 including the TFT 24, and configured for providing a data signal to the pixel electrode 25 which is electrically connected to the TFT 24, and the gate electrode of the TFT 24 is electrically connected to the scan line 22 below the pixel unit 23 including the TFT 24, and configured for controlling the turn-on or turn-off of the pixel unit 23 in which the pixel electrode 25 electrically connected to the TFT 24 is disposed.

Figure 3A:
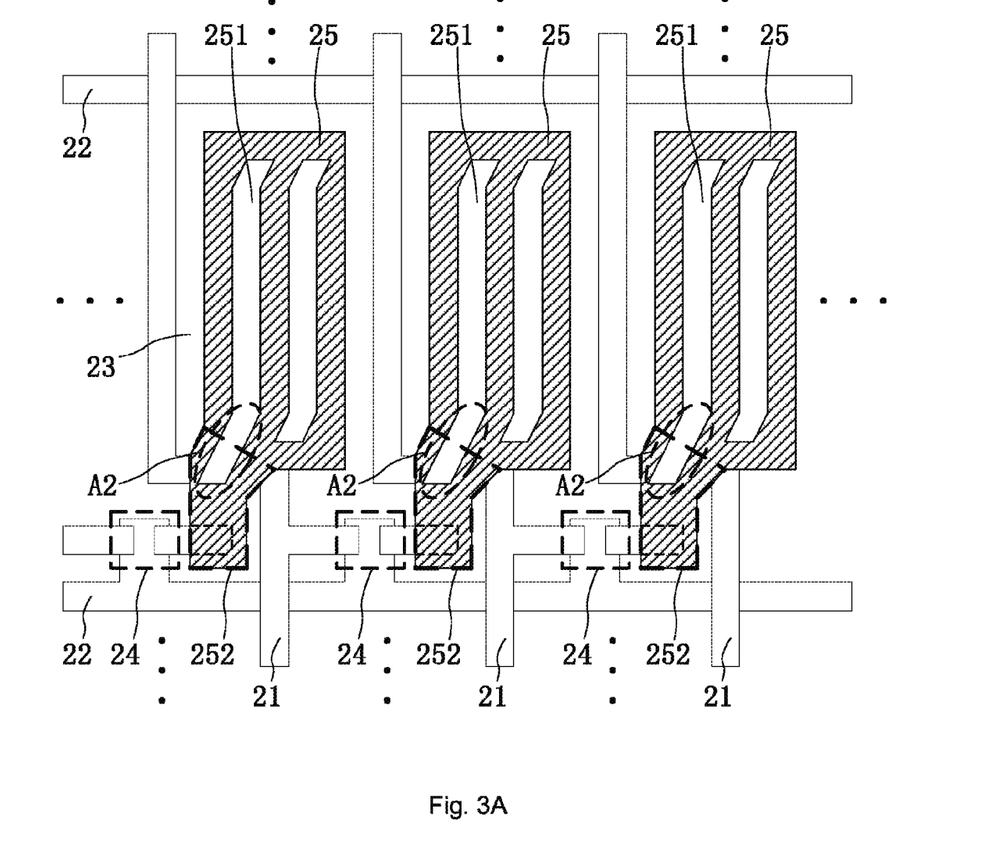
FIG. 3A is a schematic diagram showing a pixel structure according to embodiments of the disclosure.
Figure 3B:
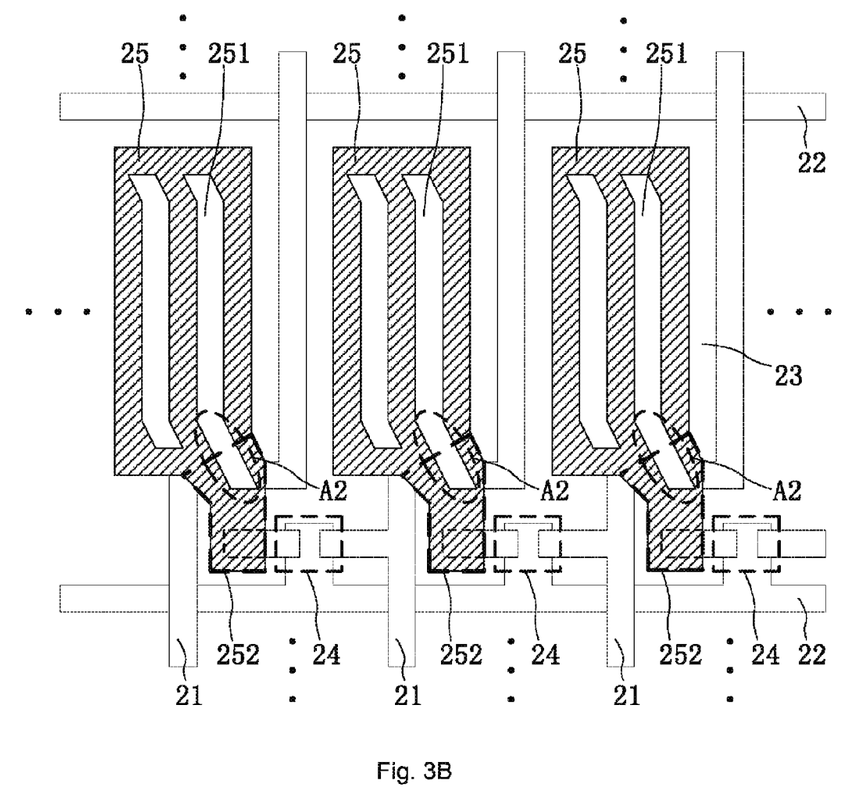
FIG. 3B is a schematic diagram showing a pixel structure according to embodiments of the disclosure.

As shown in FIG. 2A and FIG. 2B, the pixel units 23 are arranged in an array. Alternatively, as shown in FIG. 3A and FIG. 3B, the pixel units 23 may be arranged in a staggered manner. The detailed description of the pixel structure arranged in a staggered manner as shown in FIG. 3A and FIG. 3B may refer to the relevant description of FIG. 2A and FIG. 2B, which will not be repeated herein.

As shown in FIG. 2A and FIG. 3A, the pixel electrode 25 in a row is electrically connected to the TFT 24 in a pixel unit 23, the pixel unit 23 is disposed in the same row as and adjacently at the left side of the pixel unit 23 containing the pixel electrode 25, such that this pixel electrode 25 partially overlaps with the data line 21 between the pixel electrode 25 and its left adjacent pixel electrode 25; as shown in FIG. 2B and FIG. 3B, the pixel electrode 25 in a row is electrically connected to the TFT 24 in a pixel unit 23, the pixel unit 23 is disposed in the same row as and adjacently at the right side of the pixel unit 23 containing the pixel electrode 25, such that the pixel electrode 25 partially overlaps with the data line 21 between the pixel electrode 25 and its right adjacent pixel electrode 25.

Figure 4:
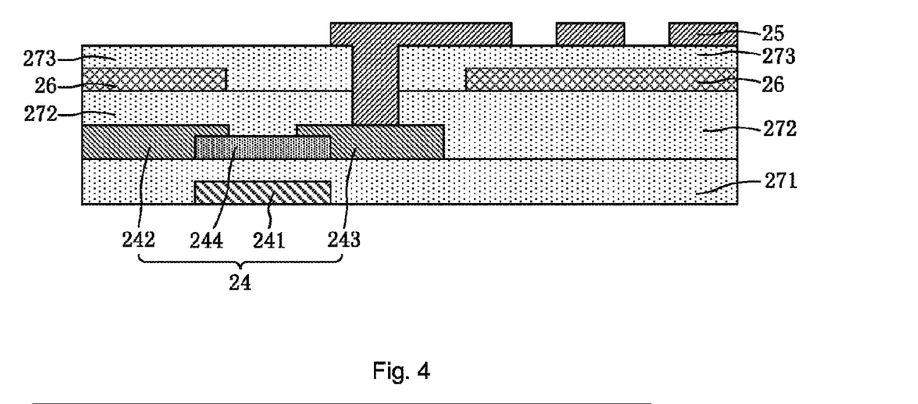
FIG. 4 is a schematic diagram showing a pixel structure according to embodiments of the disclosure.

Based on the pixel structure described above, as shown in FIG. 4, the pixel structure further includes a common electrode 26 located between the pixel electrode 25 is located and a film layer where a source electrode 242 and a drain electrode 243 of the TFT 24 electrically connected with the pixel electrode 25 are located, and the common electrode 26 is electrically insulated from the pixel electrode 25 by a third insulating layer 273, and the common electrode 26 is electrically insulated from the source electrode 242 and the drain electrode 243 by a second insulating layer 272. In addition, as shown in FIG. 4, a gate electrode 241 of the TFT 24 is covered by the first insulating layer 271, and an active layer 244 is disposed above the first insulating layer 271. The source electrode 242 and the drain electrode 243 are disposed at two sides of the active layer 244 and both electrically connected to the active layer 244. The source electrode 242, the drain electrode 243 and the active layer 244 are insulated from the gate electrode 241 by the first insulating layer 271, and the source electrode 243 is electrically connected to the pixel electrode 25.

Due to the overlap between the pixel electrode 25 and the data line 21, an influence on electrical signals might be generated while working. Therefore, the common electrode 26 is disposed between the pixel electrode 25 and the source electrode 242 as well as the drain electrode 243 of the TFT 24, thereby shielding the electrical signals at the overlap between the pixel electrode 25 and the data line 21.

It is noted that the gate electrode 241 is disposed below the source electrode 242 and the drain electrode 243 in the TFT 24 as shown in FIG. 4, however such disposal is an example of the arrangement of the gate electrode 241. In other embodiments, the gate electrode 241 may be disposed above the source electrode 242 and the drain electrode 243, which is not limited herein.

Figure 5:
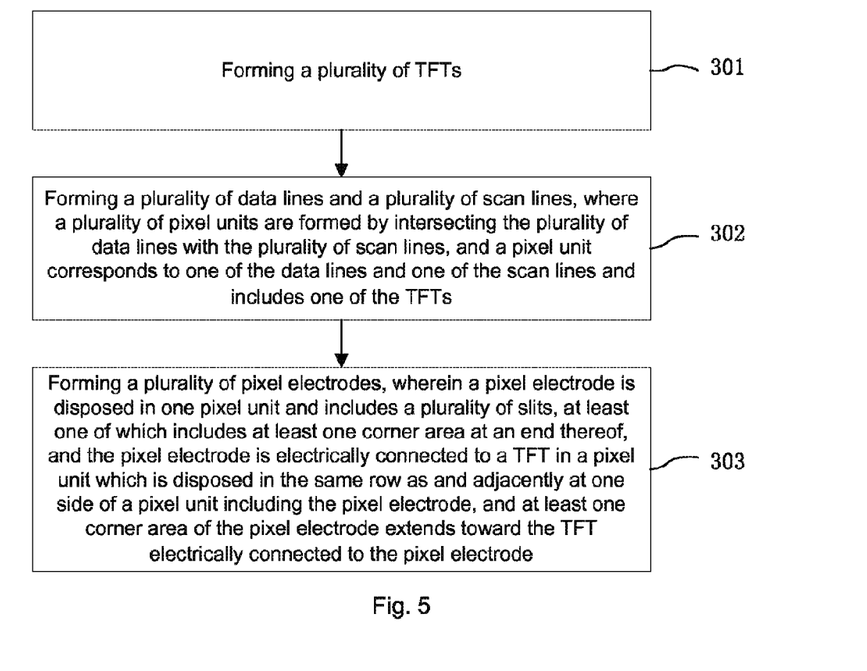
FIG. 5 is a flow chart of a method for manufacturing a pixel structure according to embodiments of the disclosure.

According to embodiments of the disclosure, a manufacturing method for manufacturing a pixel structure is provided. FIG. 5 is a flow chart of a method for manufacturing a pixel structure according to embodiments of the disclosure. As shown in FIG. 5, the method for manufacturing a pixel structure includes the following Steps 301 to 303.

At Step 301, a plurality of TFTs are formed;

Each of the formed TFTs includes a gate electrode, a source electrode, a drain electrode and an active area disposed between the drain electrode and the drain electrode, where the gate electrode of the TFT may be disposed above the source electrode and the drain electrode (as in a TFT with a top gate structure), or may be disposed below the source electrode and the drain electrode (as in a TFT with a bottom gate structure), which is not limited herein.

At Step 302, a plurality of data lines and a plurality of scan lines are formed, where a plurality of pixel units formed by intersecting the data lines with the scan lines, where a pixel unit corresponds to one data line and one scan line and includes one TFT.

At Step 303, a plurality of pixel electrodes are formed, where a pixel electrode is disposed in one pixel unit and includes a plurality of slits each of which has at least one corner area at an end thereof, the pixel electrode in a row is electrically connected to a TFT in a pixel unit, the pixel unit is disposed in the same row as and adjacently at one side of the pixel unit containing the pixel electrode, and at least one corner area of the pixel electrode extends toward the TFT electrically connected to the pixel electrode.

Figure 6:
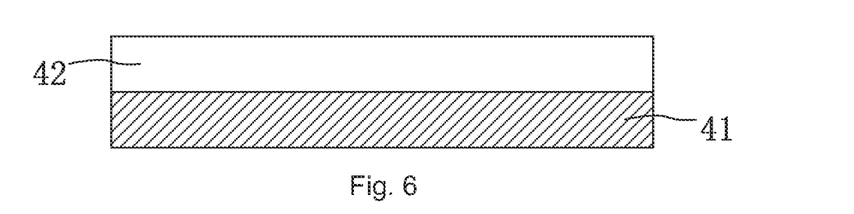
FIG. 6 is a schematic diagram showing an array substrate according to embodiments of the disclosure.

According to embodiments of the disclosure, an array substrate is provided. FIG. 6 is a schematic diagram showing an array substrate according to embodiments of the disclosure. As shown in FIG. 6, the array substrate includes a glass substrate 41 and a pixel structure 42, and the pixel structure 42 may be any pixel structure described in the above various embodiments.

Figure 7:
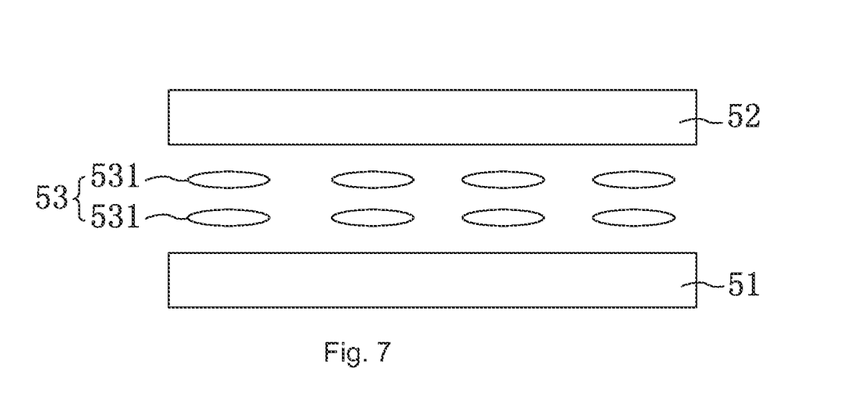
FIG. 7 is a schematic diagram showing a display panel according to embodiments of the disclosure.

According to embodiments of the disclosure, a display panel is further provided. FIG. 7 is a schematic diagram showing a display panel according to embodiments of the disclosure. As shown in FIG. 7, the display panel includes an array substrate 51, a color filter substrate 52 disposed opposite to the array substrate 51, and a liquid crystal layer 53 disposed between the array substrate 51 and the color filter substrate 52, where the liquid crystal layer 53 is made up of liquid crystal molecules 531. The array substrate 51 may be any array substrate described in the above various embodiments.

It is noted that the above display panel may have or not have a touch sensing function, depending on specific needs in practice. The touch sensing function may be an electromagnetic touch sensing function, a capacitive touch sensing function, an electromagnetic capacitive touch sensing function or the like.

Figure 8:
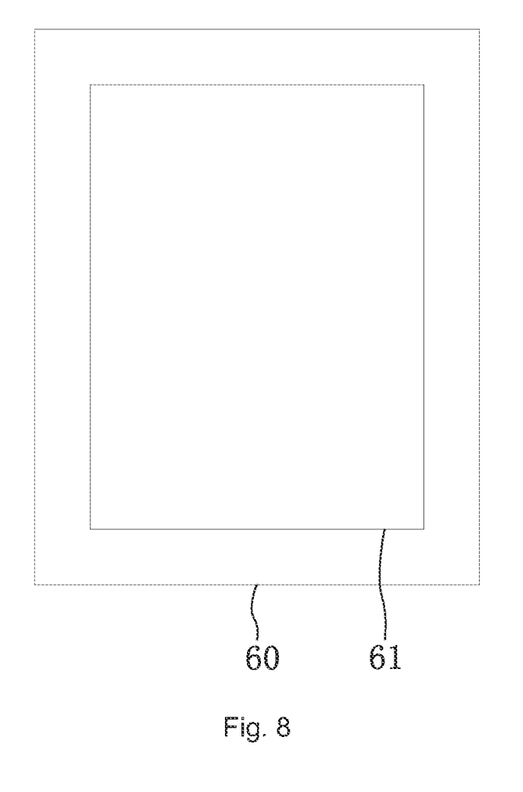
FIG. 8 is a schematic diagram showing a display device according to embodiments of the disclosure.

According to embodiments of the disclosure, a display device is further provided. FIG. 8 is a schematic diagram showing a display device according to embodiments of the disclosure. As shown in FIG. 8, the display device 60 includes a display panel 61, and may further include a drive circuit and other components for supporting a normal operation of the display device 60. The display panel 61 may be any display panel described in the above various embodiments. The above display device may be one of a mobile phone, a desktop computer, a notebook computer, a tablet computer and an electronic paper.

With the pixel structure and the manufacturing method thereof, the array structure, the display panel and the display device according to embodiments of the disclosure, a pixel electrode in a row is electrically connected to a TFT in a pixel unit, the pixel unit is disposed in the same row as and adjacently at one side of a pixel unit containing the pixel electrode, and at least one corner area of the pixel electrode extends toward the TFT electrically connected to the pixel electrode, so that a length of the extended corner area is increased, and accordingly an end of the corner area is disposed close to the TFT electrically connected to the pixel electrode including the corner area, therefore the end of the corner area can be well covered by a black matrix of a color filter substrate after the color filter substrate is attached to the array substrate, thereby improving the light transmittance.

It is noted that embodiments and the applied technology principles of the disclosure are described as above. It should be understood that the disclosure is not limited to particular embodiments described herein. Various apparent changes, readjustments and alternatives can be made without departing from the scope of protection of the disclosure. Therefore, although the disclosure is illustrated in detail through the above embodiments, the disclosure is not limited to the above embodiments, and can further include more of other equivalent embodiments without departing from the conception of the disclosure. The scope of the disclosure is subject to the appended claims.

Various modifications and additions can be made to the exemplary embodiments discussed without departing from the scope of the disclosure. For example, while the embodiments described above refer to particular features, the scope of this disclosure also includes embodiments having different combinations of features and embodiments that do not include all of the described features. Accordingly, the scope of the disclosure is intended to embrace all such alternatives, modifications, and variations as fall within the scope of the claims, together with all equivalents thereof.

We claim:

1. A pixel structure comprising:
   a plurality of data lines;
   a plurality of scan lines;
   a plurality of pixel units formed by intersecting the plurality of data lines with the plurality of scan lines, wherein each of the plurality of pixel units corresponds to a respective one of the data lines and a respective one of the scan lines; and
   a TFT and a pixel electrode disposed in each of the pixel units, wherein the pixel electrode comprises a plurality of slits, at least one of the slits comprises at least one corner area at an end thereof;
   wherein the plurality of pixel units comprise a first pixel unit and a second pixel unit, the first pixel unit and the second pixel unit are in a same row and adjacent to each other, the pixel electrode in the first pixel unit is electrically connected to the TFT in the second pixel unit, and the at least one corner area at the end of the at least one of the slits in the first pixel unit extends toward the TFT in the second pixel unit.

2. The pixel structure of claim 1, wherein the TFT is disposed close to the pixel electrode electrically connected thereto.

3. The pixel structure of claim 2, wherein a portion of a data line is bent in the pixel unit where the TFT is disposed, so as to match a position of the TFT.

4. The pixel structure of claim 1, wherein the pixel electrode partially overlaps with the data line which disposed between two adjacent pixel electrodes.

5. The pixel structure of claim 4, further comprising a common electrode located between the pixel electrode and a film layer, a source electrode and a drain electrode of the thin film transistor electrically connected with the pixel electrode are located in the film layer, and the common electrode is insulated from the pixel electrode and the film layer.

6. The pixel structure of claim 1, wherein a source of the TFT is electrically connected to the data line corresponding to the pixel unit comprising the pixel electrode electrically connected to the TFT; and
   a gate electrode of the TFT is electrically connected to the scan line corresponding to the pixel unit comprising the pixel electrode electrically connected to the TFT.

7. The pixel structure of claim 1, wherein the pixel units are arranged in a staggered manner or as a matrix.

8. The pixel structure of claim 1, wherein, the pixel electrode in the first pixel unit is electrically connected to the TFT in the second pixel unit through a bridging conductive line, and the at least one corner area extend into the bridging conductive line.

9. A manufacturing method for a pixel structure, comprising:
   forming a plurality of TFTs;
   forming a plurality of data lines and a plurality of scan lines, wherein a plurality of pixel units are formed by intersecting the plurality of data lines with the plurality of scan lines, and each of the plurality of pixel units corresponds to a respective one of the data lines and a respective one of the scan lines and includes a respective one of the TFTs; and
   forming a plurality of pixel electrodes, wherein each of the plurality of pixel electrodes is disposed in a respective one pixel unit and comprises a plurality of slits, at least one of which comprises at least one corner area at an end thereof, and the plurality of pixel units comprise a first pixel unit and a second pixel unit, the first pixel unit and the second pixel unit are in a same row and adjacent to each other, the pixel electrode in the first pixel unit is electrically connected to the TFT in the second pixel unit, and the at least one corner area at the end of the at least one of the slits in the first pixel unit extends toward the TFT in the second pixel unit.

10. The manufacturing method of claim 9, wherein the pixel electrode in the first pixel unit is electrically connected to the TFT in the second pixel unit through a bridging conductive line, and the at least one corner area extend into the bridging conductive line.

11. A display panel, comprising an array substrate which comprises a pixel structure comprising:
   a plurality of data lines;
   a plurality of scan lines;
   a plurality of pixel units formed by intersecting the plurality of data lines with the plurality of scan lines, wherein each of the plurality of pixel units corresponds to a respective one of the data lines and a respective one of the scan lines; and
   a TFT and a pixel electrode disposed in each of the pixel units, wherein the pixel electrode comprises a plurality of slits, at least one of the slits comprises at least one corner area at an end thereof;
   wherein the plurality of pixel units comprise a first pixel unit and a second pixel unit, the first pixel unit and the second pixel unit are in a same row and adjacent to each other, the pixel electrode in the first pixel unit is electrically connected to the TFT in the second pixel unit, and the at least one corner area at the end of the at least one of the slits in the first pixel unit extends toward the TFT in the second pixel unit.

12. The display panel of claim 11, wherein the pixel electrode in the first pixel unit is electrically connected to the TFT in the second pixel unit through a bridging conductive line, and the at least one corner area extend into the bridging conductive line.

13. A display device, comprising a display panel which comprises an array substrate, the array substrate comprises a pixel structure comprising:
   a plurality of data lines;
   a plurality of scan lines;
   a plurality of pixel units formed by intersecting the plurality of data lines with the plurality of scan lines, wherein each of the plurality of pixel units corresponds to a respective one of the data lines and a respective one of the scan lines;
   a TFT and a pixel electrode disposed in each of the pixel units, wherein the pixel electrode comprises a plurality of slits, at least one of the slits comprises at least one corner area at an end thereof; and
   wherein the plurality of pixel units comprise a first pixel unit and a second pixel unit, the first pixel unit and the second pixel unit are in a same row and adjacent to each other, the pixel electrode in the first pixel unit is electrically connected to the TFT in the second pixel unit, and the at least one corner area at the end of the at least one of the slits in the first pixel unit extends toward the TFT in the second pixel unit.

14. The display device of claim 13, wherein the pixel electrode in the first pixel unit is electrically connected to the TFT in the second pixel unit through a bridging conductive line, and the at least one corner area extend into the bridging conductive line.

* * * * *